(12) United States Patent
Wang et al.

(10) Patent No.: US 8,907,227 B2
(45) Date of Patent: Dec. 9, 2014

(54) MULTIPLE SURFACE INTEGRATED DEVICES ON LOW RESISTIVITY SUBSTRATES

(75) Inventors: Ruonan Wang, Hong Kong (HK); Yan Liu, Hong Kong (HK); Song He, Hong Kong (HK); Tingting Wang, Hong Kong (HK)

(73) Assignee: Hong Kong Science and Technology Research Institute Company Limited, Hong Kong Science Park Shatin, New Territories, Hong Kong (CN)

( * ) Notice: Subject to any disclaimer, the term of this patent is extended or adjusted under 35 U.S.C. 154(b) by 85 days.

(21) Appl. No.: 13/564,730

(22) Filed: Aug. 2, 2012

(65) Prior Publication Data

US 2014/0036462 A1 Feb. 6, 2014

(51) Int. Cl.
*H05K 1/03* (2006.01)

(52) U.S. Cl.
USPC ........... 174/256; 174/262; 174/264; 174/260; 174/254; 174/255; 361/761; 361/762; 361/763; 361/764; 361/782

(58) Field of Classification Search
CPC ....... H05K 1/0353; H05K 1/165; H05K 1/16; H01F 27/2804; H01L 23/645; H01L 23/482; H01L 23/585
See application file for complete search history.

(56) References Cited

U.S. PATENT DOCUMENTS

| 5,773,870 | A | 6/1998 | Su et al. |
| 6,075,427 | A * | 6/2000 | Tai et al. ............. 333/219 |
| 6,150,227 | A | 11/2000 | Kinoshita |
| 6,169,008 | B1 | 1/2001 | Wen et al. |
| 6,221,727 | B1 | 4/2001 | Chan et al. |
| 6,638,844 | B1 | 10/2003 | Verma et al. |
| 6,987,983 | B2 | 1/2006 | Kondo et al. |
| 7,612,428 | B2 | 11/2009 | Park et al. |

(Continued)

FOREIGN PATENT DOCUMENTS

| CN | 1938901 A | 3/2007 |
| CN | 101030577 A | 9/2007 |
| JP | 2004119593 A | 4/2004 |

OTHER PUBLICATIONS

"Resistivity and Temperature Coefficient at 20 C" from Georgia State University, silicon resistivity.*
"DuPont Kapton Polyimide Film Datasheet" Boedeker.com, polyimide resistivity.*

(Continued)

*Primary Examiner* — Tuan T Dinh
*Assistant Examiner* — Steven T Sawyer
(74) *Attorney, Agent, or Firm* — Ella Cheong Hong Kong; Sam T. Yip (57) ABSTRACT

The present invention relates to a device with portions of the device on plural substrate surfaces. The device includes a low resistivity substrate having first and second surfaces with a first electrically-conductive device component disposed over a first surface. An intermediate electrically-insulating layer may be disposed between the electrically-conductive component and the low resistivity substrate. A second electrically-conductive component is disposed over the second surface of the low resistivity substrate. A cavity formed in the low resistivity substrate is at least partially filled with a high resistivity material. One or more electrically-conducting pathways are formed in the high resistivity material electrically connecting the first electrically conductive component and the second electrically-conductive component to form a device. Exemplary devices include inductors, capacitors, antennas and active or passive devices incorporating such devices. Vertically integrated device systems can be formed using the device.

20 Claims, 10 Drawing Sheets

(56) References Cited

U.S. PATENT DOCUMENTS

| | | |
|---|---|---|
| 7,911,014 B2 | 3/2011 | Doan |
| 2003/0148739 A1* | 8/2003 | Kosemura et al. .............. 455/73 |
| 2006/0118965 A1* | 6/2006 | Matsui .......................... 257/774 |
| 2006/0192267 A1 | 8/2006 | Park et al. |
| 2010/0176660 A1* | 7/2010 | Fouquet et al. ............... 307/109 |
| 2011/0024888 A1* | 2/2011 | Pagaila et al. ................. 257/686 |
| 2011/0067917 A1* | 3/2011 | Park et al. ..................... 174/350 |
| 2011/0272780 A1 | 11/2011 | Smeys et al. |

OTHER PUBLICATIONS

"Resistivity and Temperature COefficient at 20 C", from Georgia State University; silicon resistivity; Oct. 31, 2000 (dated by https://archive.org/web/).*

"Kapton Polyimide Film Specifications" Boedeker.com, polyimide resistivity; Sep. 29, 2000 (dated by https://archive.org/web/).*

Office Action issued from the State Intellectual Property Office of the People's Republic of China on Jul. 2, 2014.

* cited by examiner

MULTIPLE SURFACE INTEGRATED DEVICES ON LOW RESISTIVITY SUBSTRATES

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to electrical devices having device portions on multiple substrate surfaces and, more particularly, to devices including high Q factor integrated passive devices on low resistivity substrates that incorporate high resistivity materials.

BACKGROUND

As integrated circuits (IC) decrease in size and increase in functionality, there is increased competition for IC space by more devices and higher-performance devices. Integrated passive devices (IPDs) are one class of devices that form an important part of integrated circuits, particularly in devices that communicate over wireless networks. Since certain devices, such as inductors, have performance that is linked to device size (for example, the total length of a metal trace on a substrate), new ways need to be found to increase performance without increasing the device "footprint" (that is, the amount of space occupied on a substrate that is shared with other electrical components).

SUMMARY OF THE INVENTION

The present invention relates to a device on a low resistivity substrate having device portions on at least two substrate surfaces. Exemplary low resistivity substrates have resistivities in a range on the order of 0.1 ohm-cm to 10 ohm-cm such as low resistivity silicon. Exemplary devices include an integrated passive device such as inductors, capacitors, and antennas and combinations thereof; it also includes active devices that are integrated with one or more of these devices. Portions of the device are positioned on upper and lower surfaces of the substrate and electrically communicate through a conductive pathway through the substrate.

In particular, the present invention relates to a device positioned on a low resistivity substrate having a resistivity in a range on the order of 0.1 ohm-cm to 10 ohm-cm. Exemplary low resistivity substrates are non-metals such as semiconductors and certain low-resistivity/semiconducting/partially conductive ceramics or polymers having first and second surfaces with a first electrically-conductive component disposed over the first surface of the low resistivity substrate. An intermediate electrically-insulating layer may be disposed between the electrically-conductive component and the low resistivity substrate. A second electrically-conductive component is disposed over the second surface of the low resistivity substrate with an optional intermediate electrically-insulating layer. A cavity formed in the low resistivity substrate is at least partially filled with a high resistivity material.

One or more electrically-conducting pathways are formed in the high resistivity material electrically connecting the first electrically conductive component and the second electrically-conductive component to form one or more integrated passive devices.

DETAILED DESCRIPTION

Figure 1:
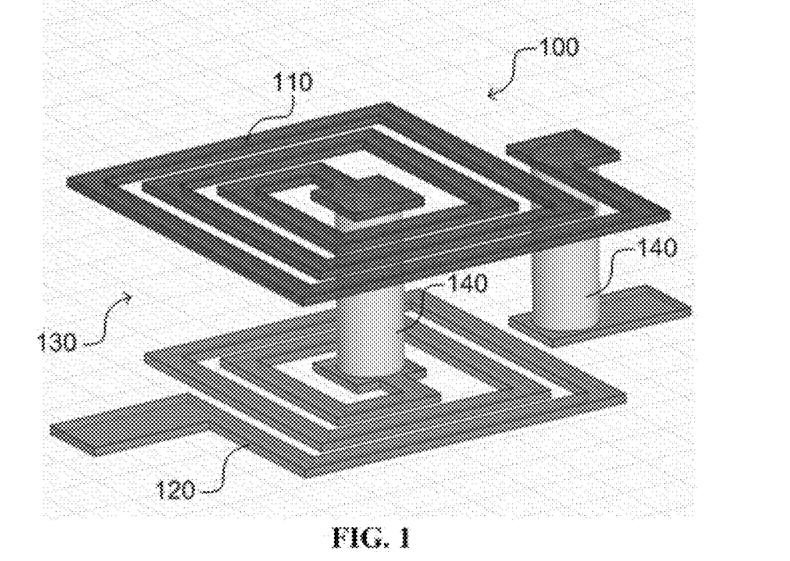
FIG. 1 depicts a device according to an embodiment of the present invention.

Turning to the drawings in detail, FIG. 1 depicts an embodiment of a device 100 according to the present invention. In the exemplary embodiment shown, device 100 is an integrated passive device such as an inductor having a first coil 110 and a second coil 120 positioned over a low-resistivity substrate 130 (not shown in FIG. 1 for clarity of presentation). However other passive and active-passive device combinations can be formed according to the teachings of the present invention as discussed below.

Conductive pathways 140 electrically permit electrical communication between coil 110 and coil 120. As used herein, the expression "low resistivity" relates to materials that have a conductivity/resistivity on the order of 0.1 ohm-cm to 10 ohm-cm. Such materials are typically semiconductors or low-resistivity ceramics or polymers. It is noted that most pure metals and metal alloys have substantially lower resistivities than the above range and are not contemplated for use as the low resistivity substrate.

Figure 2:
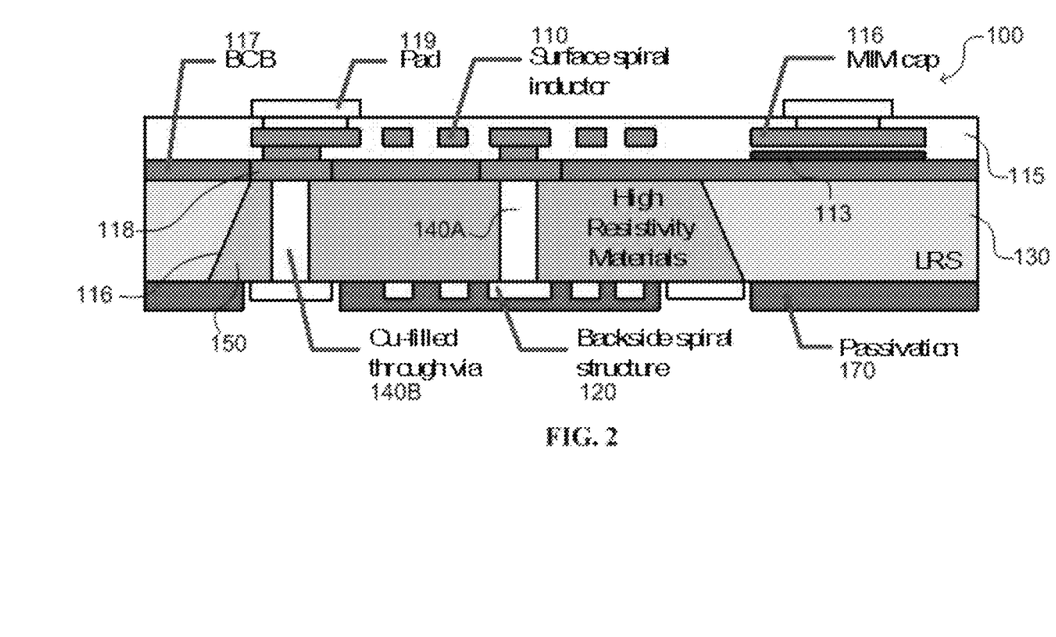
FIG. 2 depicts a cross-sectional view of the device of FIG. 1.

A side view of the device of FIG. 1 is depicted in FIG. 2 with more detail than is shown in FIG. 1. In FIG. 2, a first component portion such as a first inductor coil 110 is embedded within isolation material 115 which is positioned over low resistivity substrate 130. Isolation material 115 can be a resist material or other polymeric materials. In an exemplary embodiment, low resistivity substrate 130 is low resistivity silicon although other materials may also be used. Advantageously, silicon can be processed with CMOS-compatible processing techniques; however, it is not required that CMOS-compatible techniques be used.

Interposed between inductor coil 110 and substrate 130 is a high resistivity material 117 to provide isolation between the inductor and the substrate. In a particular embodiment, layer 117 is selected from high resistivity polymers such as BCB (bisbenzocyclobutene) which have a high dielectric constant. Advantageously, BCB can be made photosensitive and thus be patterned using lithographic processes. Through patterning, openings can be formed for metallization 118 (e.g., bonding pads/terminal points for later via formation). Over the surface of isolation layer 115, bonding pad 119 is formed to permit device 100 to interconnect with other devices. MIM (metal insulator metal) capacitor 116 is positioned over element 113.

A cavity 160 is formed in substrate 130 and is filled with a high-resistivity material 150. By replacing a portion of the low resistivity material 130 with high resistivity material 150 in the region of the inductor coils 110 and 120, the Q factor of the resulting device is greatly increased. An exemplary high resistivity material is polyimide or SU-8 (an epoxy-based photoresist). Inductor coils 120 are formed over the high resistivity material also with further bonding pads.

To permit the inductor coils 110 and 120 to interconnect to form a single, two-surface inductor, one or more vias 140A are formed. Another type of via, 140B, can also be formed that cooperates with bonding pads for connection to other devices or integrated circuits.

A passivation layer 170 is formed over the second set of inductor coils 120. A solder resist material can be selected as the passivation layer or other suitable passivation materials that are known in the electronics fabrication art may be used. Patternable passivation materials are particularly suitable.

Figure 3A:
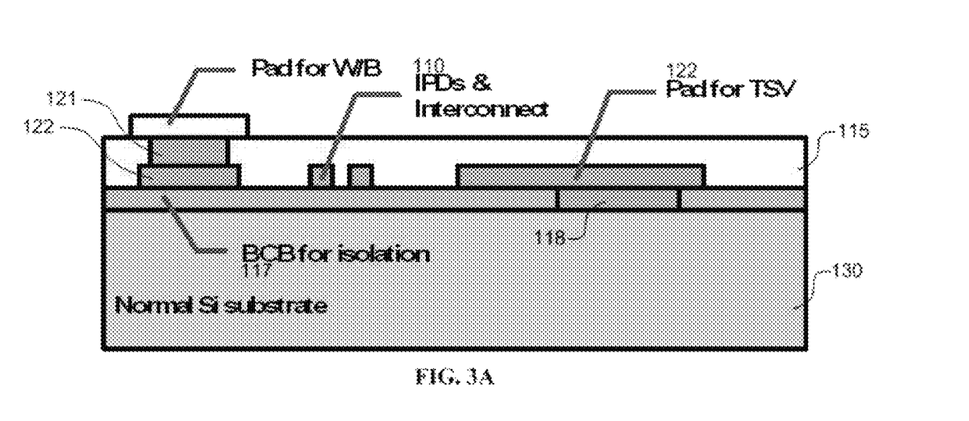
FIGS. 3A-3E show processing material processing techniques to form the device of FIG. 2.
Figure 3B:
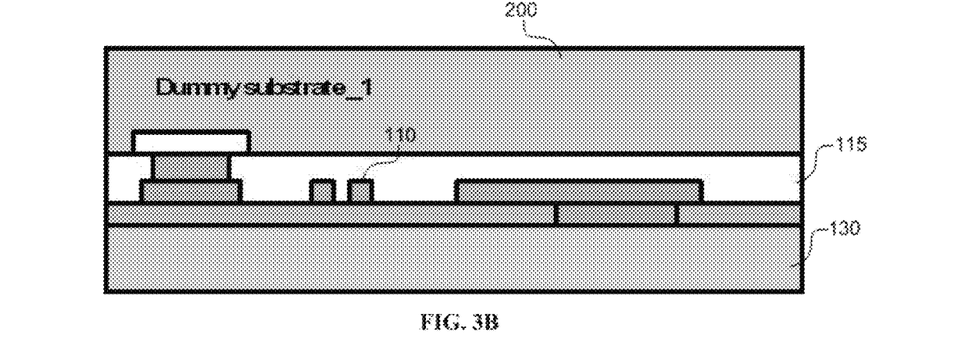

FIGS. 3A-3E depict processes for forming a two-surface device according to the present invention. Advantageously, the methods shown in these FIGS. are compatible with CMOS processing techniques so that the formed devices are easily integrated with CMOS devices and CMOS-based integrated circuits. In FIG. 3A, a first patternable isolation material layer 117 is coated on a low resistivity silicon substrate 130. A hole 118 is patterned on the first patternable isolation material layer 117 allowing the formation of via bonding pads. In this embodiment, the isolation material is photosensitive BCB. A first metal layer is built on the first patternable isolation material layer 117 and is patterned to form bonding pads 122 and interconnect 110. In this embodiment, the metal is copper. A second patternable isolation material layer 115 is deposited over the first metal layer. A hole 121 is patterned on the second patternable isolation material layer 115 allowing the formation of via bonding pads. Then a second metal layer is built on the second patternable isolation material layer 115 and is patterned to form bonding pad 119, which can optionally be used for wire-bonding or another electrical connection technique.

In FIG. 3, a handling wafer 200 is bonded over the structure of FIG. 3A. As handling wafer 200 will not form part of the final device structure, any material compatible with the formation process and having sufficient robustness to facilitate processing can be selected. Exemplary materials include silicon, glass, alumina and other ceramics, etc. Following handling wafer bonding, the low resistivity substrate material 130 is thinned, typically by a chemical, mechanical, or chemical-mechanical polishing process. The latter process is particularly suitable for substrates made of low-resistivity silicon. The final thickness of substrate 130 is typically on the order of 100 microns.

Figure 3C:
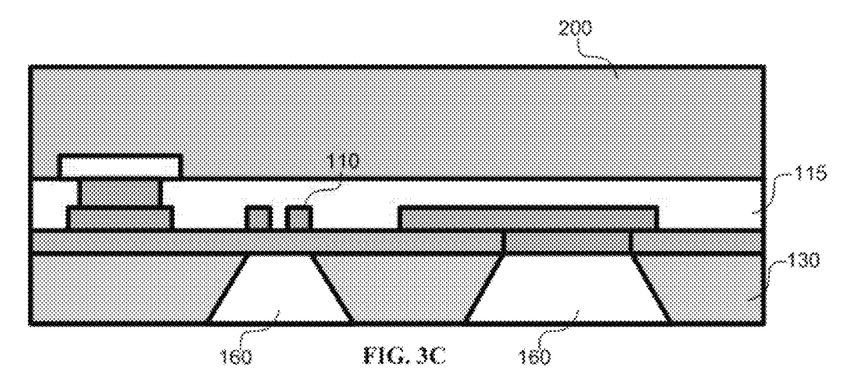

In FIG. 3C, cavities 160 are formed in substrate 130 to be filled with the resistive material and via material in later processes. For a low resistivity silicon as substrate 130, patterns can be defined by conventional lithography and cavities 160 formed by TMAH wet etching (tetramethylammonium hydroxide, an anisotropic etchant).

Figure 3D:
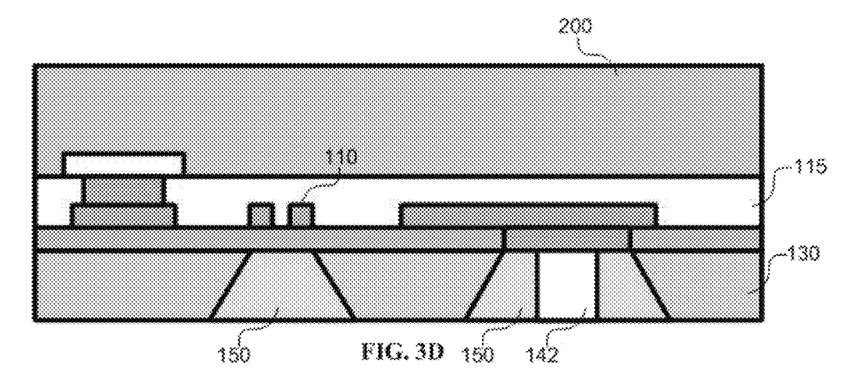

In FIG. 3D, cavities 160 are filled with high resistivity polymer 150, typically through spin coating. Exemplary polymers include polyimide and SU-8. For cavities that will also include electrical connection vias, photolithography or another suitable patterning technique is used to define the via locations and unwanted polymer is removed to create via 142. Although a single via is depicted in FIG. 3D, plural vias can be defined during this process as shown in the finished device of FIG. 2. Advantageously, forming vias in the polymer material 150 is easier than forming comparable through-silicon vias since the polymer is easier to pattern and remove.

Figure 3E:
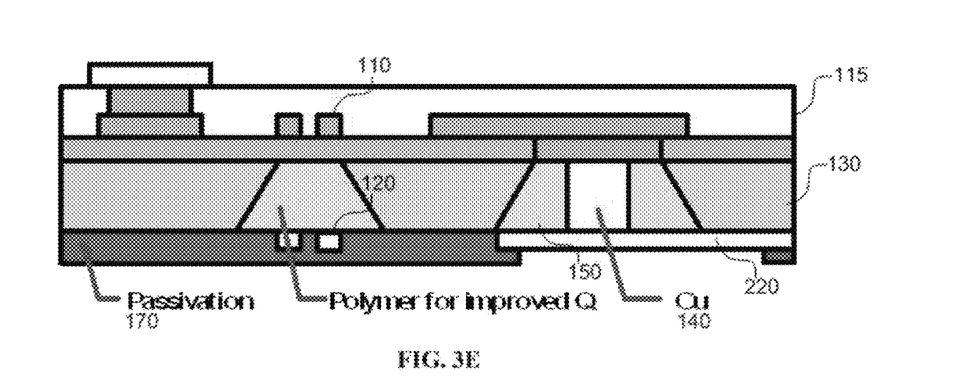

To form conductive pathways, copper is deposited in the via hole 142 to form via 140B. Subsequent metallization is used to form additional bonding pads 220 and device elements/inductor coils 120. A passivation material 170 is applied to protect the second portion 120 of the device. An exemplary passivation material can be a solder mask material which can be easily patterned. Finally, handling wafer 200 is debonded yielding the finished two-surface device.

Figure 4A:
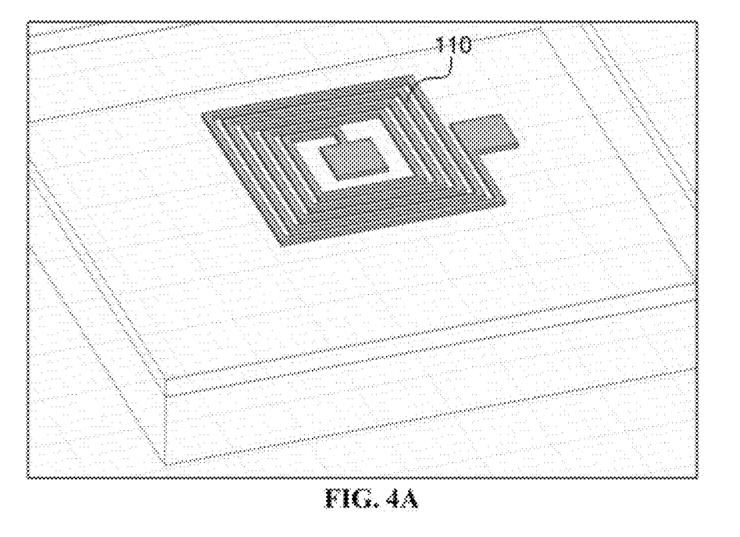
FIGS. 4A-4B show the improvement of the Q factor for an inductor formed according to the present invention.
Figure 4B:
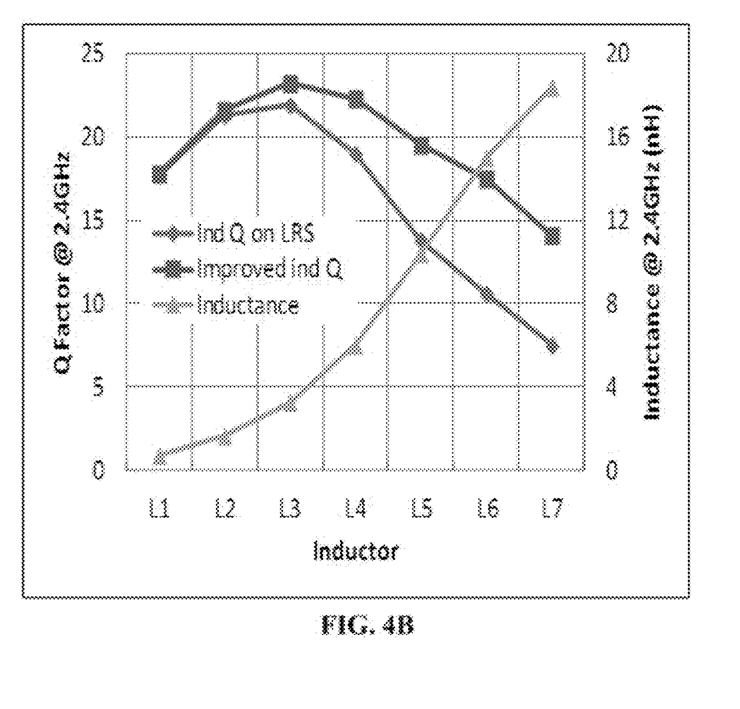
Figure 5A:
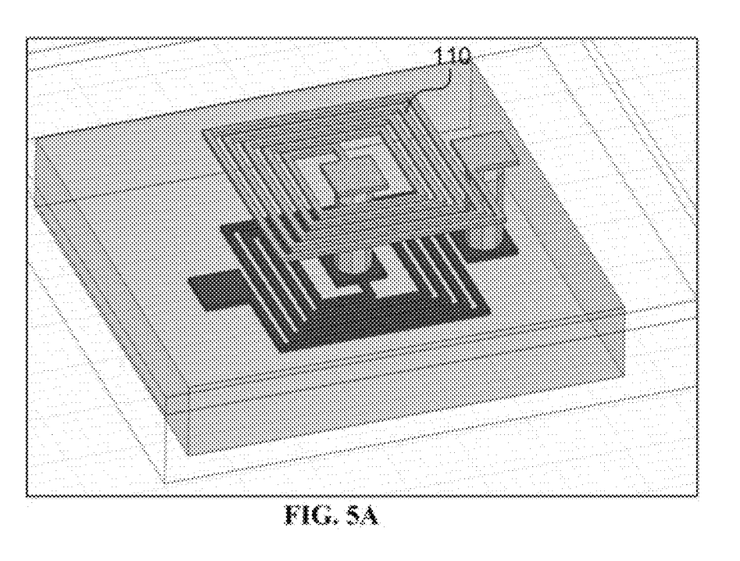
FIGS. 5A-5B show the improvement in inductance for an inductor formed according to the present invention.
Figure 5B:
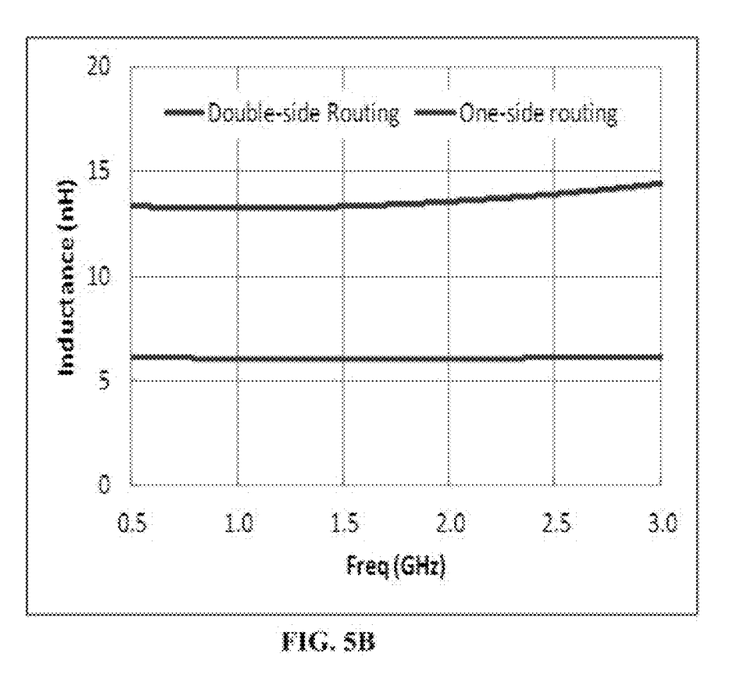

FIGS. 4A and 4B show the increase in Q factor and inductance by replacing a portion of a low resistivity substrate with high resistance polymer for a single-sided inductor. FIGS. 5A and 5B show the increase in inductance for a two-sided inductor having a high-resistivity material embedded in a low-resistivity substrate. Both sets of FIGS. measure inductance in the ISM band (in the range of 2.4 GHz), the band in which many wireless networks operate.

Figure 6A:
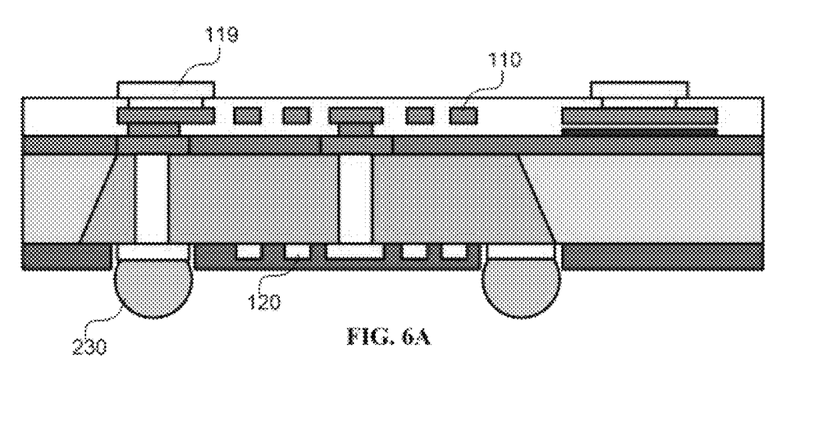
FIGS. 6A-6D depict applications of the present invention.
Figure 6B:
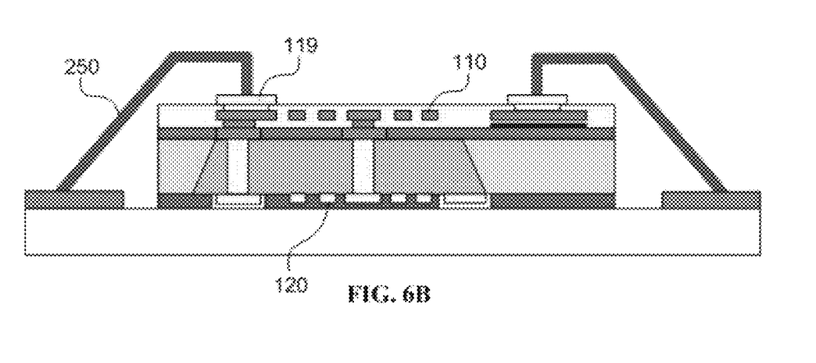
Figure 6C:
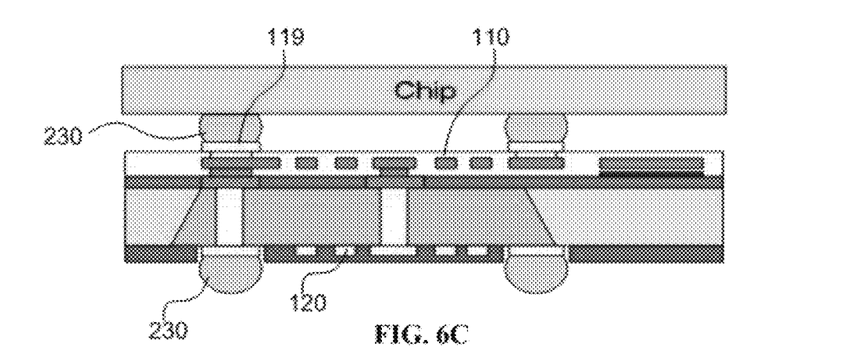
Figure 6D:
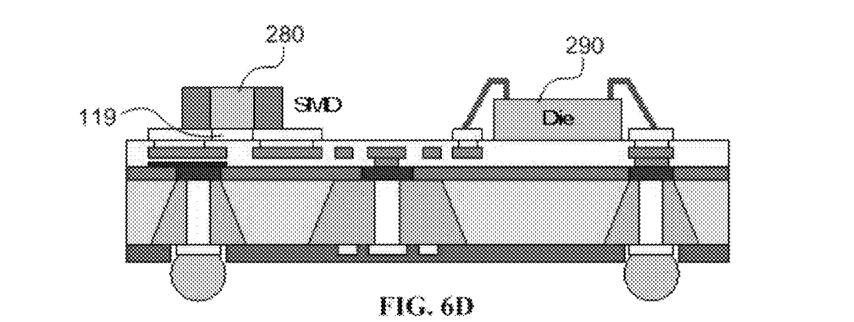

FIGS. 6A-6D demonstrate a variety of applications for the multi-surface devices of the present invention. In FIG. 6A, an inductor is formed by elements 110 and 120. Solder balls 230 on the backside of the device permit connection to a motherboard. In FIG. 6B, wire bonding pad 119 supports wire 250 for interconnection to other devices supported on a common substrate/motherboard. In FIG. 6C, multiple devices can be vertically integrated through electrical connections facilitated by solder ball 230. These devices can be passive or active devices depending upon the overall electronic structure being formed. In FIG. 6D, wire bonding pad 119 is used for connection to a surface mount device (SMD) 280. Die 290 is also depicted as interconnected with the device 100 thorough bonding pads and wire bonds. These examples are non-limiting and show a portion of the applications in which the devices of the present invention can be integrated with other components and integrated circuits.

Figure 7:
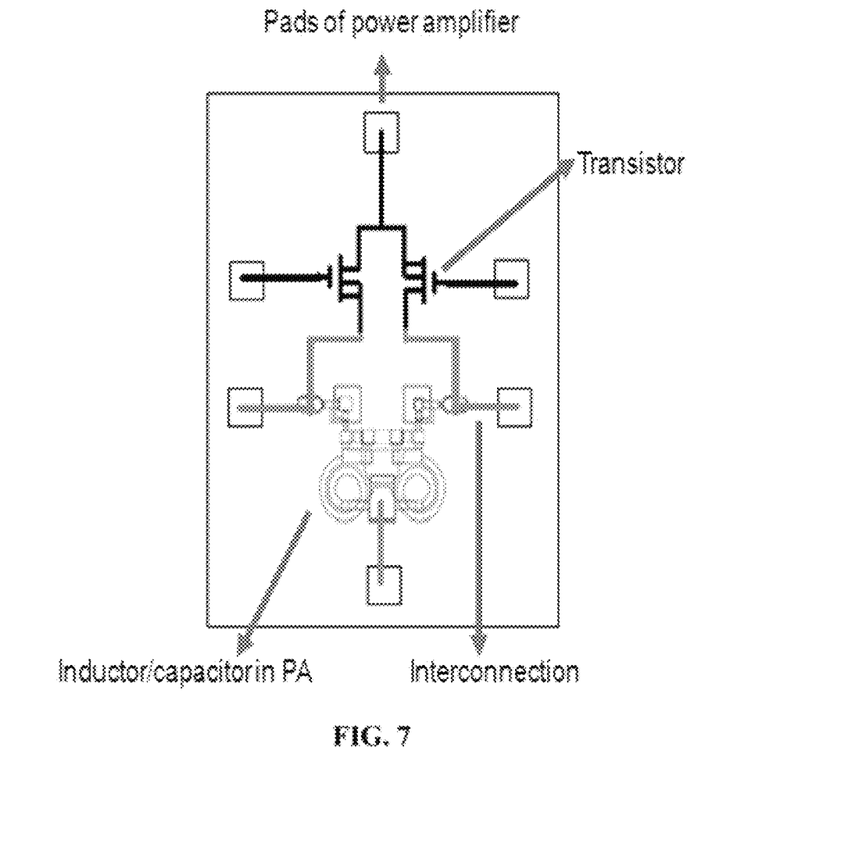
FIG. 7 depicts an active device/passive device combination formed according to the present invention.

FIG. 7 depicts a further application of the devices of the present invention. In FIG. 7 a power amplifier 500 is interconnected with a device 100 (e.g., a capacitor and/or inductor) formed according to the invention. Thus the present invention is applicable to both active and passive devices.

Note that the connection between devices can be in series or parallel and the devices can be used together or separately. Active and/or passive devices can be stacked in vertically integrated stacks.

While the foregoing invention has been described with respect to various embodiments, such embodiments are not limiting. Numerous variations and modifications would be understood by those of ordinary skill in the art. Such variations and modifications are considered to be included within the scope of the following claims.

What is claimed is:

1. A device having at least a device component positioned on one of a plurality of substrate surfaces comprising:
    a first substrate having a resistivity of approximately 0.1 ohm-cm to approximately 10 ohm-cm and having at least first and second surfaces;
    a first electrically-conductive component disposed over the first surface of the first substrate with or without an intermediate electrically-insulating layer;
    a second electrically-conductive component disposed over the second surface of the first substrate;
    a cavity formed in the first substrate;
    a second material having a resistivity higher than resistivity of the first substrate at least partially filling the cavity in the first substrate; and
    one or more electrically-conductive pathways formed in the second material electrically connecting the first electrically-conductive component and the second electrically-conductive component to form the device;

wherein at least one of the first electrically-conductive component and the second electrically-conductive component comprises one or more passive electrical coils embedded within at least one isolation material for resisting changes in electric current;

wherein the one or more passive electrical coils are disposed over at least a portion of the second material; and wherein the isolation material is positioned over the first substrate.

2. The device according to claim 1 further comprising a second device integrated therewith.

3. A vertically integrated device stack including the device of claim 1.

4. The device according to claim 1, wherein the second material having a resistivity equal or higher than approximately 10 to the power of 12 ohm-cm and lower than approximately 10 to the power 16 ohm-cm.

5. The device according to claim 1 wherein the isolation material includes a resist material or polymeric material.

6. The device according to claim 1 wherein each of the first electrically-conductive component and the second electrically-conductive component comprises the one or more passive electrical coils.

7. The device according to claim 1 wherein the second material is filled into the cavity with an epoxy-based photoresist through spin coating, following with photolithography to remove unwanted epoxy-based photoresist for formation of the electrically-conductive pathways.

8. The device according to claim 1 wherein a layer of photosensitive bisebzocyclobutene is interposed between the first substrate and the one or more passive electrical coils.

9. The device according to claim 1 wherein one of the first electrically-conductive component and the second electrically-conductive component comprises one or more passive electrical coils covered by a passivation layer.

10. The device according to claim 2 wherein the device and the second device are connected in series or in parallel.

11. The device according to claim 2 wherein the device and the second device are configured to be separately used.

12. The vertically integrated device stack according to claim 3 wherein the vertically integrated device stack includes an active device.

13. A method for forming a device having at least a device component positioned on one of a plurality substrate surfaces comprising: providing a first substrate having a resistivity of approximately 0.1 ohm-cm to approximately 10 ohm-cm and having at least first and second surfaces; forming a first electrically-conductive component and disposing the first electrically-conductive component over the first surface of the first substrate with or without the intermediate electrically-insulating layer; forming the second electrically-conductive component and disposing the second electrically-conductive component over the second surface of the first substrate; removing a portion of the first substrate to form the cavity; filling the removed portions of the first substrate with a second material having a resistivity higher than resistivity of the first substrate; forming vias through the second material and forming conductive pathways in the vias connecting to one or more of the first and second bonding pads; forming the one or more electrically-conductive pathways in the second material electrically connecting the first electrically-conductive component and the second electrically-conductive component to form the device; wherein at least one of the first electrically-conductive component and the second electrically-conductive component comprises one or more passive electrical coils embedded within at least one isolation material for resisting changes in electric current; wherein the one or more passive electrical coils are disposed over at least a portion of the second material; and wherein the isolation material is positioned over the first substrate.

14. A method according to claim 13 wherein the device is an integrated passive device.

15. A method according to claim 13 further comprising integration of further devices vertically above the first surface or vertically below the second surface of the first substrate.

16. A method according to claim 13 wherein the first substrate is silicon.

17. A method according to claim 13 wherein the second material is a high resistivity polymer.

18. A method according to claim 13, wherein the second material having a resistivity equal or higher than approximately 10 to the power of 12 ohm-cm and lower than approximately 10 to the power 16 ohm-cm.

19. A method according to claim 14 wherein the integrated passive device is selected from one or more of inductors, capacitors, or antennas.

20. A method according to claim 15 wherein the further devices are selected from active or passive devices.

* * * * *